(12) United States Patent
Cheng et al.

(10) Patent No.: US 7,910,884 B2
(45) Date of Patent: Mar. 22, 2011

(54) APPARATUS AND METHOD FOR INSPECTION AND MEASUREMENT

(75) Inventors: Zhaohui Cheng, Tokyo (JP); Natsuki Tsuno, Kunitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 251 days.

(21) Appl. No.: 12/349,059

(22) Filed: Jan. 6, 2009

(65) Prior Publication Data
US 2009/0179151 A1   Jul. 16, 2009

(30) Foreign Application Priority Data
Jan. 11, 2008   (JP) ................. 2008-004407

(51) Int. Cl.
*G01N 23/22* (2006.01)
*G21K 7/00* (2006.01)
*H01J 37/256* (2006.01)

(52) U.S. Cl. ..... 250/306; 250/307; 250/310; 250/492.2; 250/492.22; 250/492.3; 382/145

(58) Field of Classification Search .................. 250/306, 250/307, 310, 492.2, 492.22, 492.3; 382/145
See application file for complete search history.

(56) References Cited

U.S. PATENT DOCUMENTS

| 6,586,736 | B1  | 7/2003  | McCord |
| 7,019,294 | B2* | 3/2006  | Koyama et al. ............... 250/311 |
| 7,276,693 | B2* | 10/2007 | Koyama et al. ............... 250/310 |
| 7,557,347 | B2* | 7/2009  | Shojo et al. .................... 250/310 |
| 7,655,906 | B2* | 2/2010  | Cheng et al. ................... 250/307 |
| 2007/0040118 | A1 | 2/2007 | Cheng et al. |

FOREIGN PATENT DOCUMENTS

| JP | 2000-208579 | 7/2000 |
| JP | 2004-342470 | 12/2004 |
| JP | 2006-234789 | 9/2006 |
| WO | 03/007330   | 1/2003 |

* cited by examiner

*Primary Examiner* — Nikita Wells
(74) *Attorney, Agent, or Firm* — Mattingly & Malur, P.C.

(57) ABSTRACT

An electrification control electrode B is installed at a measured or inspected specimen side of an electrification control electrode A, and a constant voltage is applied from an electrification control electrode control portion of an electrification control electrode B according to an electrification state of a specimen, whereby a variation of an electrification state and a potential barrier of a specimen surface formed before an inspection is suppressed. A retarding potential is applied by an electrification control electrode, and the electrification control electrode B is disposed below the electrification control electrode A adjusted to equal potential to a specimen. As a result, it is possible to adjust the amount that secondary electrons emitted from a specimen such as a wafer to which a primary electron beam is irradiated return to a specimen, and thus it is possible to stably maintain an inspection condition of high sensitivity during an inspection.

15 Claims, 8 Drawing Sheets

| SET VOLTAGE | MAT PART ELECTRIFICATION/PERIPHERAL PART ELECTRIFICATION ··· |
|---|---|
| SET CONDITION 1 | Vm1/Vp1··· |
| SET CONDITION 2 | Vm2/Vp2··· |
| ⋮ | ⋮ |
| SET CONDITION N | VmN/VpN··· |

APPARATUS AND METHOD FOR INSPECTION AND MEASUREMENT

CLAIM OF PRIORITY

The present application claims priority from Japanese patent application JP 2008-004407 filed on Jan. 11, 2008, the content of which is hereby incorporated by reference into this application.

FIELD OF THE INVENTION

The present invention relates to a technology for measuring/inspecting a fine circuit pattern formed on a substrate of, for example, a semiconductor device or a liquid crystal by using a charged particle beam, and more particularly, to a charged particle beam apparatus which controls an electrification state of a specimen surface to perform the measurement/inspection.

BACKGROUND OF THE INVENTION

A semiconductor device is manufactured by repetitively performing a process for transferring a pattern formed on a photo mask onto a wafer through a lithography process and an etching process. In a semiconductor manufacturing device, since a yield of a semiconductor device is influenced by a failure in a manufacturing process such as an etching process and generation of alien substances, it is important to inspect/measure a pattern on wafer during a manufacturing process to detect an occurrence of an abnormality or a failure as early as possible. Therefore, in a current semiconductor device manufacturing line, a technique for inspecting/measuring a state of a pattern formed on a wafer during a manufacturing process plays an important role. Conventionally, an inspection/measurement technique is mostly based on an optical microscope, but recently an inspection/measurement apparatus based on an electronic microscope is widely being spread to cope with miniaturization of a semiconductor device and sophistication of a manufacturing process. Particularly, in managing a dimension of a semiconductor circuit pattern, a length measuring scanning electron microscope (SEM) based on an electronic microscope is currently used as a quality managing means which is indispensable to a manufacturing process. In managing a dimension of a fine pattern, high surface resolution, high measuring accuracy, and high reproducibility are required, and it is also indispensable to suppress damage to a circuit pattern when measured. In order to satisfy such requirements, a primary electron beam is accelerated at high energy and is decelerated, before being incident to a specimen, at a retarding voltage applied to a specimen containing a semiconductor pattern which is a measurement target.

However, if a surface of a semiconductor device containing an insulator is scanned by a primary electron beam, an electrification state of a surface may change depending on a scanning condition. Therefore, the following faults may occur: (1) a detection rate of a secondary signal emitted from a pattern portion fluctuates, and an abnormal contrast occurs in a secondary signal image; and (2) a scanning position of a primary electron changes depending on a change of electrification, and measurement accuracy and reproducibility of a pattern dimension may deteriorate. Therefore, it is important to detect an electrification state of a semiconductor device and to feed it back to a measurement condition before measurement and to maintain an electrification state of a semiconductor device surface during measurement.

Also, in inspecting a semiconductor device, it is highly required to detect an electrical characteristic fault such as conduction and non-conduction which an optical inspection apparatus is difficult to detect, and thus an electron beam inspection apparatus comes into wide use. An electron beam inspection apparatus detects an electrical characteristic fault by charging a circuit pattern formed on a wafer surface and using a contrast actualized by it. It is called a potential contrast technique, and it is a useful means to detect an electrical characteristic fault of a semiconductor device. In order to detect such a fault with higher sensitivity, it is indispensable to appropriately charge a semiconductor device.

As a technique for controlling an electrification state of an inspected/measured specimen at high accuracy, Japanese Patent Laid-open Publication no. 2000-208579 discloses a technique that a desired voltage is applied to an electrode called an electrification control electrode disposed opposite to a specimen, and an electron beam is irradiated to a specimen from a secondary electron source, which is different from an electron source for a primary electron beam, to control electrification potential of a specimen. PCT Publication no. WO2003/7330 discloses a technique that surface potential is measured by using a surface potential meter (SPM), and a preliminary electrification/destaticization condition or an inspection/measurement condition of a semiconductor device surface is optimized based on the result.

A principle of controlling electric potential of a specimen surface using an electrification control electrode will be described with reference to FIG. 4. FIG. 4 is a diagram illustrating a disposition relationship between an inspected specimen and an electrification control electrode when a contact hole having a conduction defect formed therein is used as an inspection specimen. An inspected specimen has a structure in which a $SiO_2$ layer 405 is formed on a Si substrate 404, a contact hole is formed, and metal is embedded inside the hole as shown in a cross-sectional view of a wafer 400 of FIG. 5.

An electron source 10 and an electrification control electrode 407 are disposed above the wafer 400. The electrification control electrode 407 has a hole which a primary electron beam and a secondary charged particle pass through. Various lenses are disposed between the electron source 10 and the electrification control electrode 407 but are not shown in FIG. 4. A reference numeral 17 denotes a reflecting plate 17, and a reference numeral 411 denotes a secondary electron detector. Retarding potential 406 is applied to the wafer 400, and predetermined potential (electrification control electrode potential) 408 based on the wafer 400 is applied to the electrification control electrode 407. The primary electron beam 410 arriving at the wafer 400 interacts with the wafer to generate the secondary charged particle.

In a potential contrast technique, a difference between a normal portion and a defective portion is detected as a contrast difference of a potential contrast image. A contrast difference results from the fact that an electrification potential difference occurs since a normal portion and a defective portion are different in electric resistance, and as a result, there occurs a difference in number of secondary electrons detected. Therefore, in order to detect a fault by a potential contrast technique, there is a need for electrically charging a wafer to make a sufficient electrification potential difference between a normal portion and a defective portion. A wafer surface can be electrically charged to either of (1) a positive voltage contrast (PCV) and (2) a negative voltage contrast (NVC), and a polarity of electrification depends on a structure of a wafer which is an inspection target or an inspection condition. Here, a principle of a wafer negative voltage contrast (NVC) will be described below.

A potential distribution is formed between the electrification control electrode 407 and the wafer 400 by electric potential 408 of the electrification control electrode 407 and electric potential 406 of the wafer 400. A change of a potential distribution along an optical axis of a primary electron beam is indicated by a curve 413 of FIG. 4. As indicated by the curve 413, in the potential distribution, there exists a position where electric potential is minimum (position where electric potential becomes negative maximum), and a potential difference 412 between electric potential at the position (hereinafter, minimum potential) and wafer surface potential functions as a potential barrier of a secondary signal emitted from a wafer surface.

In the secondary signal 409 emitted from the wafer 400 by irradiation of the primary electron beam, an element that kinetic energy is higher than the potential barrier 412 goes over the barrier and is detected by the detector 411. Meanwhile, an element of the secondary signal that kinetic energy is lower than the potential barrier 412 returns to the wafer surface 414 and electrically charges the wafer to a negative. In order to electrically charge the wafer to a positive, a voltage applied to the electrification control electrode 407 is appropriately adjusted so that the number of secondary electrons emitted from the wafer can be greater than the number of electrons contained in the primary electron beam which arrives at a specimen. As a result, the wafer surface is electrically charged to a positive.

U.S. Pat. No. 6,586,736 B1 discloses an invention which applies an electrification control electrode described above. According to an invention disclosed in U.S. Pat. No. 6,586,736 B1, if an incident angle of a primary electron beam to a specimen is deflected (strays) from an electron beam optical axis, secondary charged particles which return to a specimen surface are increased, so that it is difficult to control a potential distribution of a specimen surface. In order to resolve the problem that an incident angle of a primary electron beam is deflected, U.S. Pat. No. 6,586,736 B1 employs a three-electrode structure as an electrification control electrode, sets an electrode (i.e., lowest electrode) proximal to a specimen to the same voltage as a retarding voltage, divides an intermediate electrode into left and right centering on an optical axis, and changes voltages applied to the divided electrodes left and right.

SUMMARY OF THE INVENTION

A problem in controlling an electrification control electrode in a conventional potential contrast technique will be described from a point of view of a change of a potential barrier.

FIG. 5A is an enlarged view illustrating a structure around the electrification control electrode shown in FIG. 4. If predetermined electric potential is applied to the electrification control electrode 407, a potential distribution of a concentric circle shape centering on an optical axis of the primary electron beam 410 is formed. Such a potential distribution centering on an optical axis of the primary electron beam 410 is also called on-axial potential. In FIG. 5, a reference numeral 413 denotes an equipotential line which represents a cross section of a certain equipotential surface of on-axis potential. Meanwhile, a potential distribution is formed even in an area which deviates from an optical axis of the primary electron beam 410 due to electrical potential applied to the electrification control electrode 407. Such a potential distribution formed around the primary electron beam optical axis is also called off-axis potential. In FIG. 5, a reference numeral 418 denotes an equipotential line which represents a cross section of a certain equipotential surface having off-axis potential.

However, as described above, in a potential contrast technique, a difference between a normal portion and a defective portion is detected as a contrast difference of a potential contrast image. In case where a specimen is inspected by electrically charging a defective portion to a more negative than a normal portion, since the number of secondary electrons which go over the potential barrier 412 is more in a defective portion than in a normal portion, it is more brightly seen on a potential contrast image. Such a brightness difference (contrast) between a normal portion and a defective portion is determined by an electrification state of a defective portion/normal portion and the depth of the potential barrier 412. In order to realize high stability and high reproducibility, it is necessary to maintain an optimum electrification state by constantly keeping the potential barrier 412 during an inspection.

FIG. 5B shows a comparison of energy distributions of secondary electrons respectively emitted from the defective portion 402 and the normal portion 401. It is understood that compared to an energy distribution of secondary electrons emitted from the normal portion, an energy distribution of secondary electrons emitted from the defective portion contains more elements that energy is higher than the potential barrier 412. Therefore, a contrast difference of an electron beam image can be controlled by controlling the size of the potential barrier 412.

In the electrification control system of the structure shown in FIG. 5A, electric potential applied to the electrification control electrode 407 depends on a different between a target value of electrical potential of the inspected specimen 400 and electrical potential applied to the specimen 400. That is, a difference between the retarding potential 406 and the control target value of the specimen potential is applied to the electrification control electrode 407. As a result of an experiment, however, it is turned out that a potential barrier which is deeper than the potential barrier 412 defined by the on-axis potential is formed between the wafer surface 414 and the electrode 407 in a direction apart from an optical axis due to the set potential 408 of the electrification control electrode 407.

Here, a term "electrical control system" is used as a concept containing other elements such as a control unit, a control power source, and so on as well as hardware such as an electrification control electrode. Since secondary electrons generated by irradiation of a primary electron beam are cosine-distributed by energy at the moment when they are generated, they are emitted in an off-axis direction as well as in a direction proximal to an optical axis. The emitted secondary electrons 428 are returned to the specimen surface by an off-axis potential barrier to be redirected toward the set potential 408 of the electrification control electrode 407 through the contact hole and the wafer.

For this reason, the potential barrier 412 formed between the specimen and the electrification control electrode varies from an intended value, and the acquired contrast of the potential contrast image varies from an intended value. As a result, inspection sensitivity becomes unstable, and inspection reproducibility also deteriorates.

Next, a problem of the electrification control system disclosed in U.S. Pat. No. 6,586,736 B1 will be described. In the electrification control system disclosed in U.S. Pat. No. 6,586,736 B1, the electrification control electrode includes electrodes 431, 432 and 433. During an inspection (i.e., when image data are acquired by irradiating a primary electron beam), the same voltage as a voltage 406 applied to a specimen holder on which an inspected specimen is placed, i.e., the retarding potential, is applied to the electrode 431, and electrification formed on a semiconductor device surface is suppressed during an inspection. The electrode 433 remains at ground potential. The electrode 432 is divided into two (432a and 432b) to which different voltages 435 and 436 are applied. It is an object to converge an orbit of secondary electrons emitted to an area except an electron optical axis when an electron beam is irradiated to the semiconductor device 400, thereby improving detection efficiency of secondary electrons (e.g., secondary signal 437). However, before an inspection, in order to obtain a higher contrast, pre-charging is mostly performed by irradiating a charged particle beam onto a semiconductor device surface. As a result, electrification potential of a semiconductor device surface changes, so that a potential distribution between the semiconductor device surface 414 and the electrode 431 slightly change, and even though an electron beam is irradiated under the same optical condition as an irradiation condition of an electron beam set before pre-charging, there is a possibility that a detection rate of a secondary signal or electrification of a semiconductor device surface changes during an inspection.

Also, since a pattern is formed on a semiconductor device surface, when acquiring an image while scanning an electron beam, an electron beam may be irradiated to areas (e.g., area 414a and area 414b) which are different in electrification characteristic. If an electrification characteristic changes electrification potential which can be consequently acquired changes, and thus an orbit of secondary electrons emitted from each area changes according to an electrification state of each area. This will be described with reference to FIG. 5D. An area 443 is an area which has hole patterns massed on a semiconductor device, and an area 444 represents an area around which a pattern does not exist. An electron beam is scanned up and down along an arrow shown in FIG. 5D. Since the specimen 400 moves in a horizontal direction due to a continuous stage movement, an electron beam is irradiated in order of, for example, the area 444→the area 443→the area 444 within an upper-lower scanning range. In FIG. 5D, a solid line arrow means that an electron beam arrives at a specimen, and a dotted line means that an electron beam does not arrive at a specimen due to, for example, blanking.

In case where a scanning area of the electron beam 19 overlaps the areas 443 and 444 which are different in electrification characteristic as described above, different electrification states are formed in the two areas, so that electric field of a horizontal direction is formed between the two areas. As a result, secondary electrons generated within the area 443 are bent in a constant direction. In the electrode structure shown in FIG. 5C, if voltages of the electrodes 432a and 432b are adjusted according to an orbit of secondary electrons emitted from, for example, a position 441, effective detection can be performed with respect to secondary electrons emitted from the position 441 (e.g., secondary signal 437). However, in secondary electrons emitted from a scanning position 442 which is an opposite end to the area 443 (the position 441), secondary electrons are bent in the same direction, and thus detection efficiency of a secondary signal gets worse under a voltage set condition of the electrodes 432a and 432b (e.g., secondary signal 438). Also, since division of the electrode influences the beam size or an orbit of an electron beam for inspection, deterioration of resolution or scanning transformation is unavoidable.

In a current situation, an effective means for accurately measuring an electrification state of a very small area such as a scanning area of an electron beam does not exist. Therefore, control for monitoring an electrification state of an irradiation area of an electron beam and feeding it back to a voltage applied to the electrode 432 is impossible in a current situation, and control of an applied voltage value of the electrification control electrode cannot help relying on an experience principle. Therefore, it takes a lot of time to find an optimum forming condition of an electrification state or an appropriate inspection condition for defective contrast emphasis, and even if an optimum forming condition of an electrification state is found, the forming condition is not always a condition for maintaining a stable electrification state during an inspection. As described above, the convention measurement or inspection apparatus has a problem in that it is difficult to perform an inspection of both high sensitivity and high stability.

As described above, a brightness difference (contrast) between a normal portion and a defective portion depends on an electrification state of a defective portion/normal portion and the depth of the potential barrier 412. In the present invention, an electrification control electrode B is installed below a conventional electrification control electrode A (at a measured or inspected specimen side), and a constant voltage is applied according to an electrification state of a specimen, whereby a fluctuation of an electrification state and a potential barrier of a specimen surface formed before an inspection is suppressed. Due to an electrode disposed below an electrode adjusted to equal potential to a specimen, it is possible to adjust the amount that secondary electrons emitted from a specimen return to a specimen, and it is also possible to stably maintain an inspection condition of high sensitivity during an inspection. Here, "conventional electrification control electrode" means an electrode to which equal retarding potential to a specimen can be applied and corresponds to an electrode 431 in the conventional electrode structure shown in FIG. 5C.

Various potentials are applied to the electrification control electrodes A and B related to the present invention depending on an electrification state formed on a specimen. For example, if raising electric field which prevents secondary electrons from returning to a specimen is formed between a specimen and an electrification control electrode, a specimen surface can be charged to a PVC. If deceleration electric field which has secondary electrons to return to a specimen is formed, a specimen surface is charged to a NVC. Also, in this specification, the electrification electrodes A and B may be called first and second electrification control electrodes, respectively.

In order to form an appropriate electrification state in an inspection area, an inspection/measurement apparatus of the present invention employs a means for measuring electrification of a semiconductor device to grasp an electrical characteristic of an area which is an inspection/measurement target. As a result, a set condition of an electrification/destaticization means can be optimized, whereby a proper electrification state can be formed for an inspection/measurement.

DETAILED DESCRIPTION OF THE PREFERRED EMBODIMENTS

Hereinafter, an inspection method and apparatus according to embodiments of the present invention will be described in detail with reference to drawings, and a basic configuration of the present invention will be first described with reference to FIG. 6.

Figure 6:
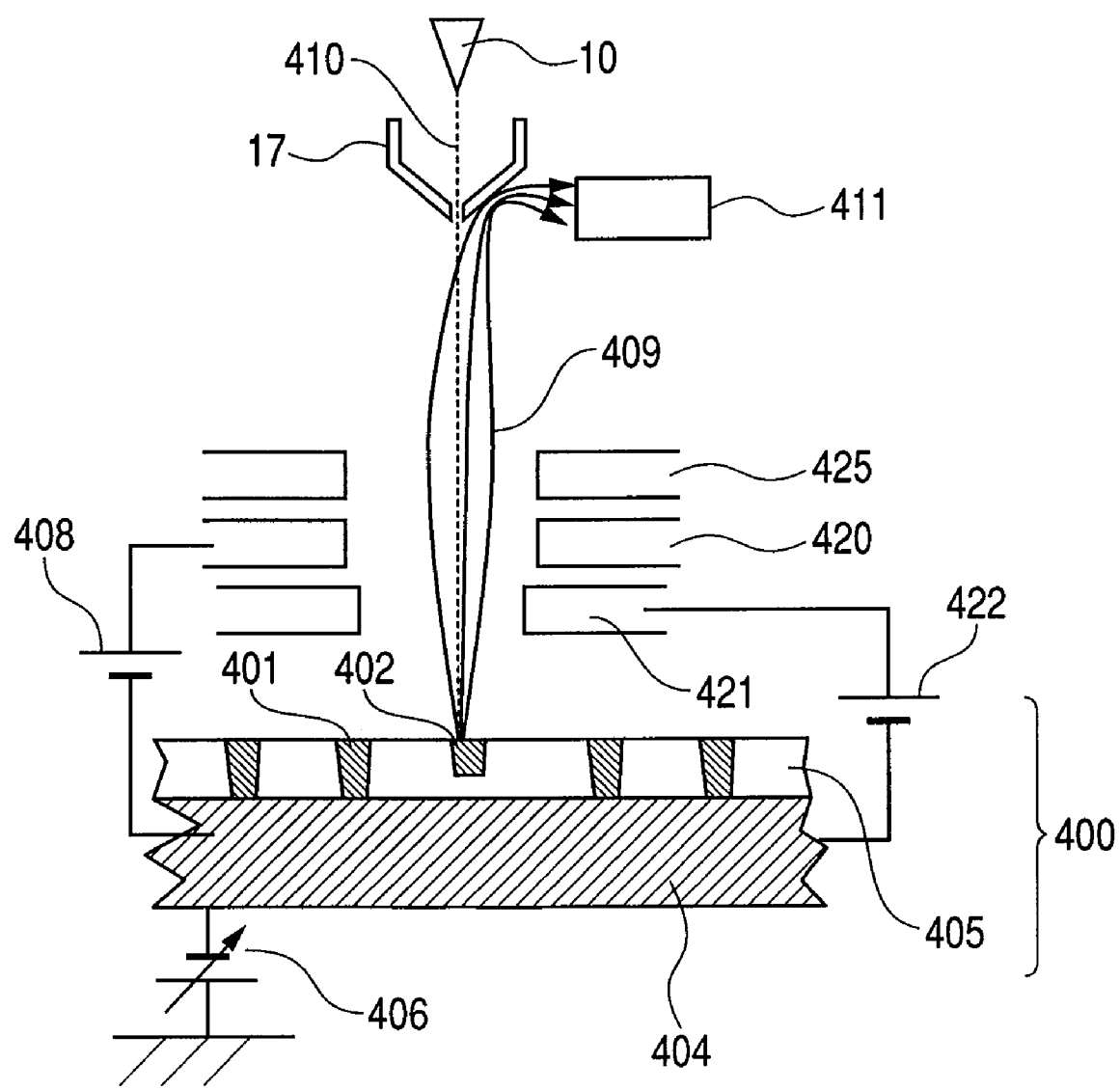
FIG. 6 is a view illustrating an electrification control electrode structure which achieves both contrast optimization and electrification stabilization during an inspection/measurement according to the present invention.

As shown in FIG. 6, an electrification control electrode B421 is installed below a conventional electrification control electrode A420, that is, at a measured or inspected specimen side, and a constant voltage is applied from a control power source 422 according to an electrification state of a semiconductor device 400 which is a specimen, whereby a fluctuation of an electrification state of a specimen surface and a potential barrier formed before an inspection is suppressed. Since the electrification control electrode B421 is disposed below the electrification control electrode A420 adjusted to equal potential to a specimen, it is possible to adjust the amount that secondary electrons emitted from a specimen return to a specimen, and it is also possible to stably maintain an inspection condition of high sensitivity during an inspection.

Also, as shown in FIG. 6, the amount which returns to the semiconductor device among the second signals 409 generated by irradiation of the primary electron beam 410 and the returning position thereof can be controlled by adjusting a voltage applied to the electrification control electrode B421 by the control power source 422 according to an electrification state of the semiconductor device 400, whereby it is possible to constantly maintain an electrification state of the semiconductor device 400 during an inspection/measurement. Since a potential difference between the electrification control electrode and the semiconductor device can be controlled within a constant range, a potential barrier can always remain constant during an inspection/measurement, thereby realizing an inspection/measurement of high sensitivity while keeping high reproducibility.

First Embodiment

Figure 1:
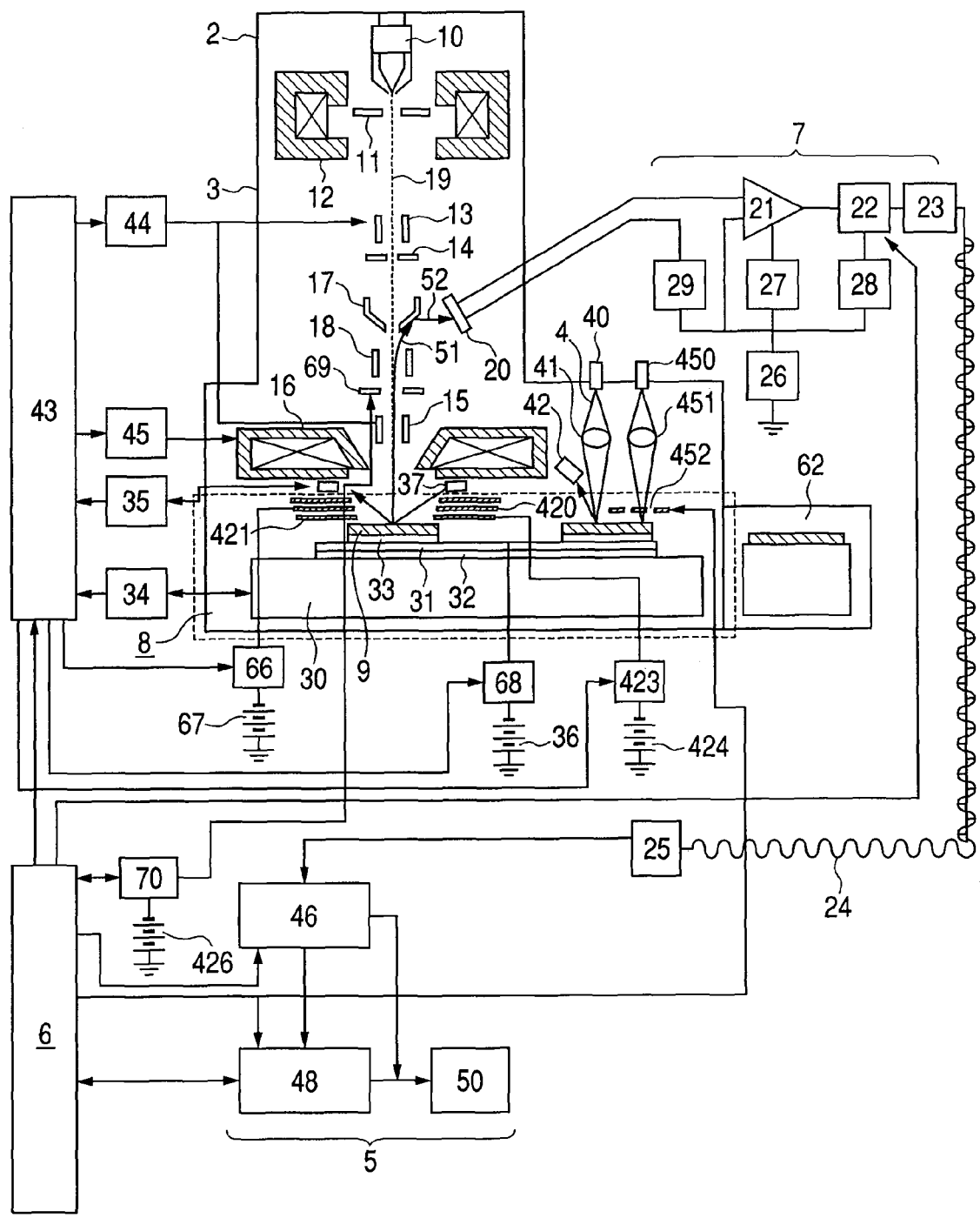
FIG. 1 is a schematic diagram illustrating a scanning type inspection/measurement apparatus of a regarding method according to a first embodiment of the present invention.

FIG. 1 shows a configuration of an inspection apparatus according to a first embodiment of the present invention. The inspection apparatus according to the first embodiment of the present invention is a scanning electron microscopy (SEM) which includes a means for measuring surface potential of a specimen and an electrification control means and may be applied to an inspection SEM, a review SEM, and a length measuring SEM.

The SEM of FIG. 1 includes a chamber 2 that the inside thereof is vacuum-exhausted and a specimen exchange chamber 62 which functions as a preliminary chamber for carrying a wafer 9 as a specimen into the chamber 2, and the preliminary chamber is configured to be vacuum-exhausted independent of the chamber 2. The inspection apparatus further includes a control portion 6 and an image processing portion 5 in addition to the chamber 2 and the preliminary chamber. The control portion 6 has a function of an apparatus controller for controlling the whole operation of the inspection apparatus, and a general-purpose computer having a central processing unit (CPU) may be used as the control portion 6.

The chamber 2 includes an electronic optical system 3, an electrification control portion which will be described later in detail, a detecting portion 7, a specimen chamber 8, and an optical microscope portion 4. In the first embodiment of the present invention, the chamber 2 means the whole vacuum vessel including the specimen chamber 8, and the electronic optical system 3, the electrification control portion, the detecting portion 7, and the optical microscope 4 operate in a decompressed state within the vacuum vessel. The specimen chamber 8 is a concept representing a space in which a specimen stage is driven within the chamber 2, and an area defined by a dotted line of FIG. 1 corresponds to the specimen chamber. As an inspected specimen, there is a semiconductor wafer on which a wire line pattern or a circuit pattern is formed, a specimen piece cut from a wafer, or a semiconductor chip having a circuit formed therein, but it is possible to observe electric potential of a specimen such as a magnetic head, a recording medium or a liquid crystal panel besides a semiconductor device.

The electronic optical system 3 includes an electron source 10, an electron beam extracting electrode 11, a condenser lens 12, a blanking deflector 13, a scanning deflector 15, an iris 14, an object lens 16, a secondary signal converging lens 69, a reflecting plate 17, and an E×B deflector 18. In the detecting portion 7, a detector 20 is disposed above the object lens within the chamber 2. An output signal of the detector 20 is amplified by a pre-amp 21 installed outside the chamber 2 and is converted into digital data by an AD converter 22.

The electrification control portion includes an electrification control electrode, an electrification control electrode control portion, and an electrification control power source, and in the configuration of FIG. 1, it includes electrification control electrodes A420 and B421 installed opposite to a stage, electrification control electrode control portions 66 and 423, and power sources 67 and 424. In FIG. 1, the electrification control electrode control portion 423 and the power source 424 function as the control power source 422 of FIG. 6 together.

If a means for measuring an electrification state of a local area neighborhood (e.g., pattern portion of the semiconductor device or peripheral area thereof) to which an electron beam is irradiated is installed in the apparatus, an electrification state formed by an electrification/destaticization means containing light or electron source is measured and fed back to an electrification/destaticization set condition, whereby an electrification state suitable for an inspection area can be formed. For example, when an electrification state of a semiconductor device measured is inspected/measured, it is fed back to a voltage (406 in FIG. 6) applied to the semiconductor device, so that a constant electric field distribution can be always maintained between the semiconductor device and the electrification control electrode, and an inspection/measurement can be performed in a set condition "as is".

A preliminary electrification/destaticization means includes an electron source or a light source 450, a lens 451, and a control electrode 452. An electron or light emitted from the electron source or the light source 450 is adjusted in dispersion by a lens to be then irradiated to the semiconductor device through the control electrode 452. A voltage applied to the control electrode 452 is controlled by the control portion 6. An electric current flowing through the electrode 452 may be interpreted by an operation portion 48 if necessary, and the interpretation result may be transmitted to the control portion 6.

The detecting portion 7 includes the detector 20 within the vacuum-exhausted chamber 2, and the pre-amp 21, the AD converter 22, an optical converter 23, an optical fiber 24, an electrical converter 25, a high voltage power source 26, a pre-amp driving power source 27, an AD converter driving power source 28, and a reverse-bias power source 29 outside the chamber 2. In the detecting portion 7, the detector 20 is disposed above the object lens 16 within the chamber 2. The detector 20, the pre-amp 21, the AD converter 22, the optical converter 23, the pre-amp driving power source 27, and the AD converter driving power source 28 are floated to positive potential by the high voltage power source 26.

The specimen chamber 8 includes a specimen stage 30, an X stage 31, a Y stage 32, a wafer holder 33, a position monitoring length measuring apparatus 34, and an optical height measuring apparatus 35. The wafer 9 is placed on the wafer holder 33.

The optical microscope portion 4 is installed at a location adjacent to the electronic optical system 3 inside the chamber 2, and they are apart from each other at a distance which does not influence each other. A distance between the electronic optical system 3 and the optical microscope portion 4 is already known. Either the X stage 31 or the Y stage 32 reciprocates a distance between the electronic optical system 3 and the optical microscope portion 4. The optical microscope portion 4 includes a light source 40, an optical lens 41, and a CCD camera 42.

Operation commands and operation conditions of respective apparatus components are inputted or outputted from the control portion 6. The control portion 6 has a database which stores control parameters or operation conditions of the electronic optical system 3, the X stage 31, the Y stage 32, and so on. Conditions—of when an electron beam is generated—such as an acceleration voltage, an electron beam deflection width, a deflecting speed, signal input timing of an inspection apparatus, a specimen stage moving speed, a set of the secondary electron converging lens are selected according to a purpose, and control of the respective apparatus components is executed. Operations of the respective apparatus components can be executed by a manual operation of a user through a user interface or can be performed according to an operation condition previously set in the control portion 6. The control portion 6 monitors deviation of the position or the height by signals of the position monitoring length measuring apparatus 34 and the optical height measuring apparatus 35 by using a correction control circuit 43, generates a correction signal based on the monitoring result, and transmits the correction signal to the lens power source 45 or the scanning deflector 44 so that an electron beam can be irradiated to a proper position. A shading state is interpreted from an SEM image formed of a secondary signal, and the information as a correction signal is transmitted to a control portion 70 of the secondary signal converging lens through the control portion 6 so that shading does not occur.

In order to acquire an image of the wafer 9, a finely concentrated electron beam 19 is irradiated to the wafer 9 to generate either or both 51 of a secondary electron or reflected electron, and detection is performed by synchronizing them with scanning of the electron beam 19 and movement of the stages 31 and 32 if necessary, whereby an image on a surface of the wafer 9 is acquired.

As the electron source 10, a thermal field emission electron source of a common type is used. Since a more stable electron beam current can be secured compared to a conventional electron source such as a tungsten (W)-filament electron source or a cold field emission electron source when the electron source 10 is used, a potential contrast image which with a small brightness fluctuation can be obtained. The electron beam 19 is extracted from the electron source 10 when a voltage is applied between the electron source 10 and the extracting electrode 11. The electron beam 19 is accelerated when negative potential of a high voltage is applied to the electron source 10.

As a result, the electron beam 19 is directed toward the specimen stage 30 at energy corresponding to the electric potential, is converged to the condenser lens 12, and is finely concentrated by the object lens 16 again to be finally irradiated to the wafer 9 placed on the X, Y stages 31 and 32 on the specimen stage 30. A scanning signal generator 44 which generates a scanning signal and a blanking signal is connected to the blanking deflector 13, and the lens power source 45 is connected to the condenser lens 12 and the object lens 16.

A negative voltage (retarding voltage Vr) can be applied to the wafer 9 on the wafer holder 33 by the retarding power source 36 and the retarding power source control portion 68. By adjusting the voltage from the retarding power source 36, it is possible to accelerate a primary electron beam and to adjust energy of the electron beam irradiated to the wafer 9 without changing electric potential of the electron source 10.

Either or both 51 of the secondary electron and the reflected electron generated by irradiating the electron beam 19 to the wafer 9 are accelerated by a negative voltage applied to the wafer 9. The secondary signal focusing lens 69 is disposed above the wafer 9, and dispersion of either or both 51 of the secondary electron and the reflected electron accelerated is adjusted by the lens 69. The control portion 70 which controls the lens 69 can vary it, in connection with an optical condition of a primary electron beam containing a negative voltage applied to a specimen and a set condition of the electrification control electrode 65. Also, the E×B deflector 18 is disposed to deflect either or both 51 of the secondary electron and the reflected electron accelerated in a predetermined direction. The deflection amount can be adjusted by a voltage and the strength of electric field applied to the E×B deflector 18. The electric field can be varied, in connection with a negative voltage applied to a specimen. Either or both 51 of the secondary electron and the reflected electron are adjusted in dispersion and directing direction by the lens 69 and the E×B deflector 18 to thereby collide with the reflecting plate 17 under a predetermined condition. If either or both 51 of the secondary electron and the reflected electron accelerated collide with the reflecting plate 17, either or both 52 of a second secondary electron and reflected electron are generated from the reflecting plate 17.

The second secondary electron and backscatter electron 52 generated by collision with the reflecting plate 17 are guided to the detector 20 due to attraction electric field. The detector 20 is configured to detect either or both 52 of the second secondary electron and reflected electron which are generated such that either or both 51 of the secondary electron and reflected electron generated while the electron beam 19 is being irradiated to the wafer 9 are accelerated to collide with the reflecting plate 17, in connection with scanning timing of the electron beam 19. An output signal of the detector 20 is amplified by the pre-amp 21 installed outside the chamber 2 and is converted into digital data by the AD converter 22. The AD converter 22 is configured to immediately convert the analog signal which is detected by the detector 20 and then amplified by the pre-amp 21 into a digital signal to be transmitted to the image processing portion 5. Since the analog signal detected is digitalized directly after detected and is then transmitted, a high speed signal with a high SN ratio can be obtained. Here, as the detector 20, for example, a semiconductor detector may be used.

The wafer 9 is placed on the X, Y stages 31 and 32, and an inspect may be executed by selecting either of a method for stopping the X, Y stages 31 and 32 and two-dimensionally scanning the electron beam 19 and a method for continuously moving the X, Y stages 31 and 32 in a Y direction and scanning the electron beam 19 in an X direction in a straight line form. In case of inspecting a relatively small area, a method for stopping the stages to perform an inspection is effective, whereas in case of inspecting a relatively large area, a method for moving the stages to perform an inspection is effective. If it is required to blank the electron beam 19, the electron beam 19 is deflected by the blanking deflector 13 so that the electron beam does not pass through the iris 14.

As the position monitoring length measuring apparatus 34, in the first embodiment of the present invention, a length measuring system using laser interference is used. It is configured to monitor positions of the X stage 31 and the Y stage 32 in real time and to transmit them to the control portion 6. Data such as the number of rotations of the wafer holder 33 as well as data about the X stage 31 and the Y stage 32 are also transmitted to the control portion 6 from the respective drivers, and the control portion 6 is configured to accurately recognize an area or a position to which the electron beam 19 is irradiated based on these data, and deviation of an irradiation position of the electron beam 19 is corrected by the correction control circuit 43 in real time if necessary. Also, an area to which an electron beam is irradiated is memorized for each wafer.

As the optical height measuring apparatus 35, an optical measuring apparatus of a measuring method which does not use an electron beam, for example, a laser interference measuring apparatus or a reflected-light type measuring apparatus, is used. The optical height measuring apparatus 35 is configured to measure the height of the wafers 9 placed on the X, Y stages 31 and 32 in real time. In the first embodiment of the present invention, used is a technique that white light emitted from the light source 37 is irradiated to the wafer 9, a position of reflected light is detected by a position detecting monitor, and a variation of the height is computed based on a change of a position. A focal distance of the object lens 16 for finely concentrating the electron beam 19 is dynamically corrected based on measured data of the optical height measuring apparatus 35, so that the electron beam 19 always focused on a non-inspection area can be irradiated. Bending or height transformation of the wafer 9 may be measured in advance before irradiation of an electron beam, and a correction condition of the object lens 16 may be set for each inspection area based on the measurement data.

The image processing portion 5 includes an image storing unit 46, a computing unit 48, and a monitor 50. In the computing unit 48, a software for computing electrification potential on an inspected specimen surface based on the detection result of the detector 7 and a software for processing the detection result of the detector 7 to perform a defect inspection of an inspected specimen are stored, and an operation for detecting electrification potential and an operation for a defect inspection are executed. Even though not shown in the drawing, the monitor 50 is equipped with an information input means through which an apparatus user sets or inputs information necessary for a control system of an apparatus, and a user interface is configured by the monitor 50 and the information input means. An image signal of the wafer 9 detected by the detector 20 is amplified by the pre-amp 21, is digitalized by the AD converter 22, is converted into an optical signal by the optical converter 23, is transmitted through the optical fiber 24, is converted into an electrical signal by the electrical converter 25, and is stored in the image storing unit 46.

An irradiation condition of an electron beam and various detection conditions of the detection system to form an image are set in advance, and are stored in the database in a file form.

Figure 2:
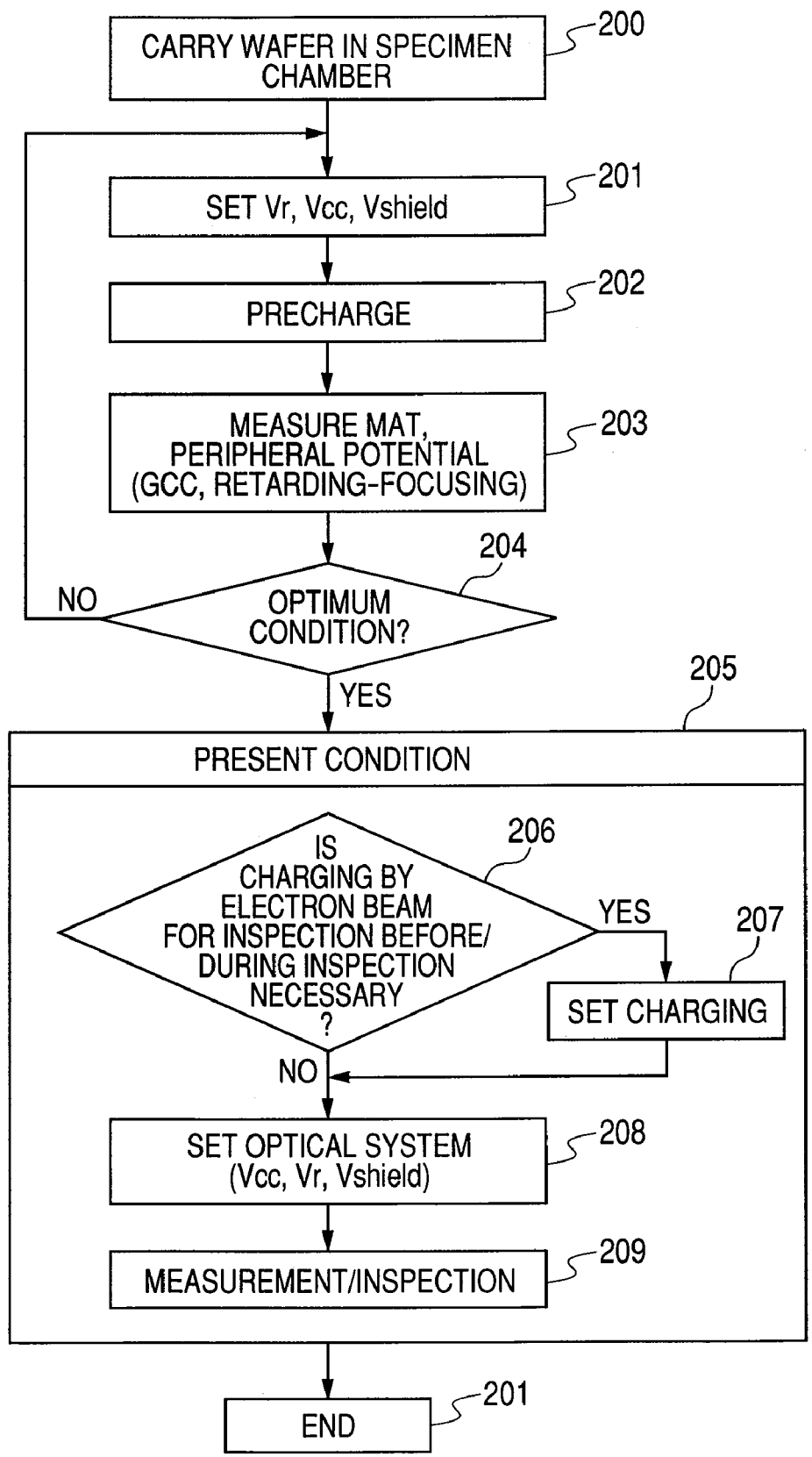
FIG. 2 is a view illustrating an inspection/measurement sequence according the first embodiment of the present invention.

Next, in the apparatus configuration according to the first embodiment of the present invention, a sequence for inspecting/measuring a semiconductor device will be described with reference to FIG. 2. A semiconductor device is carried into the specimen chamber 8 through the specimen exchange chamber 62 (200). Then, the retarding voltage Vr and an initial voltage are applied to the electrification control electrodes A and B (201) to pre-charge or destaticize a required area (202). Electrification of a pattern area which is an inspection target and a peripheral area thereof is measured (203), and pre-charging or destaticizing is repetitively performed until they becomes an optimum electrification state necessary for an inspection/measurement (204). After pre-charging/destaticizing is finished, it is transferred to a present inspection phase (205), it is determined whether to charge a semiconductor device or not before or after inspection/measurement image acquisition by using an electron beam for an inspection/measurement (206), a charging setting is performed if necessary (207), an electronic optical system for an inspection/measurement is set (208) to perform a measurement/inspection (209), and the sequence is finished (210). The reason for performing a setting containing each electrode in an inspection/measurement is to use an optimum value for an inspection/measurement corresponding to an electrification state after pre-charging/destaticizing.

In order to pre-charge or destaticize a semiconductor device, besides a primary electron beam for an inspection/measurement, a pre-charge/destaticizing light source/electron source may be used.

Next, a setting of each electrode in an inspection/measurement will be described centering on a case where a semiconductor device is charged to a negative by pre-charging and an a non-conduction fault inspection of a hole pattern is performed. In order to maintain an electrification state of a semiconductor device during an inspection/measurement, it is necessary to set a voltage between a pattern area which is an inspection target and an electrification control electrode to a small value during an inspection/measurement (<10 V). Electrification of a semiconductor device by pre-charging is measured, and the electrification voltage is absorbed by adjusting at least of the electrification control electrode B421 and the retarding voltage Vr. A set voltage between the electrification control electrode B421 and a semiconductor device surface during an inspection/measurement depends on an electrical characteristic of a semiconductor device and thus is determined by an empirical value or a previous investigation result.

Figure 5A:
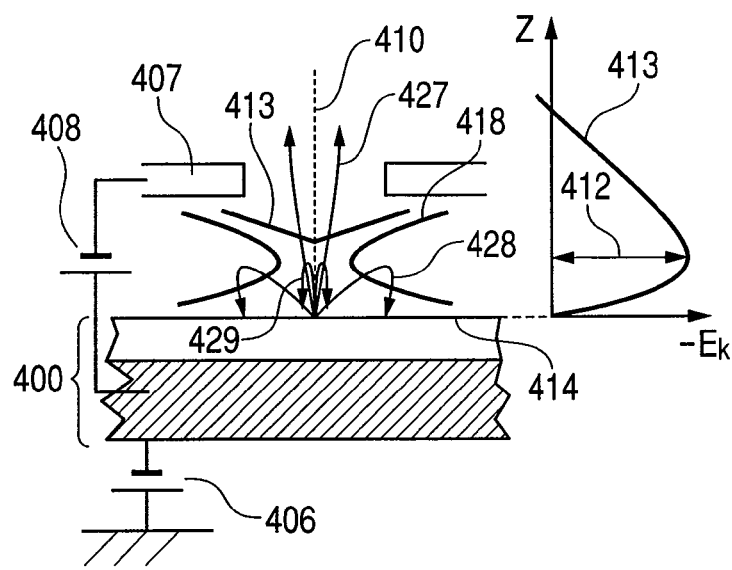
FIG. 5A is an enlarged view illustrating a structure around the electrification control electrode shown in FIG. 4.
Figure 5B:
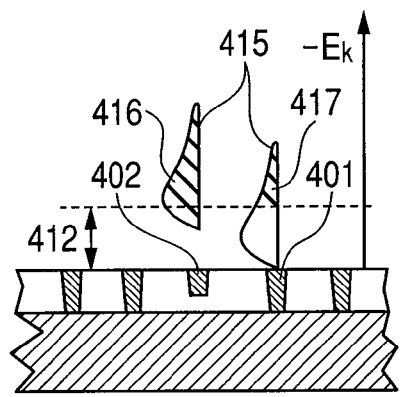
FIG. 5B shows a comparison of energy distributions of secondary electrons respectively emitted from the defective portion and the normal portion.
Figure 5C:
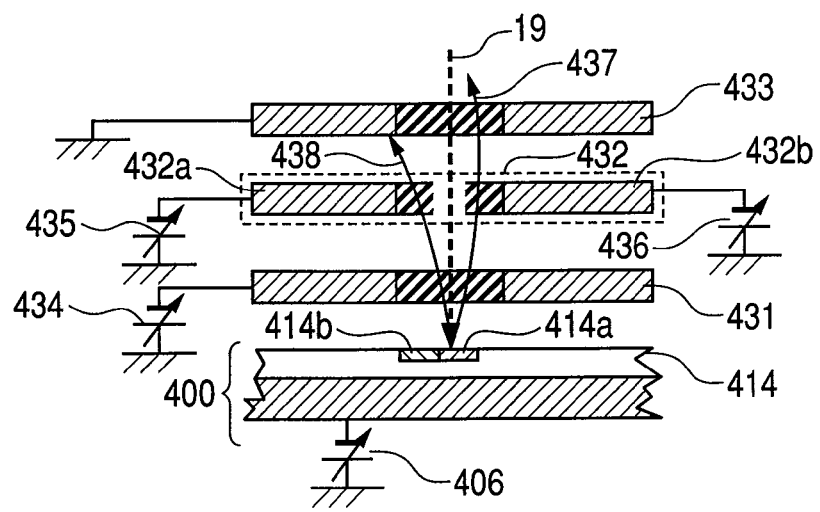
FIG. 5C shows a structure of a conventional electrification control electrode.
Figure 5D:
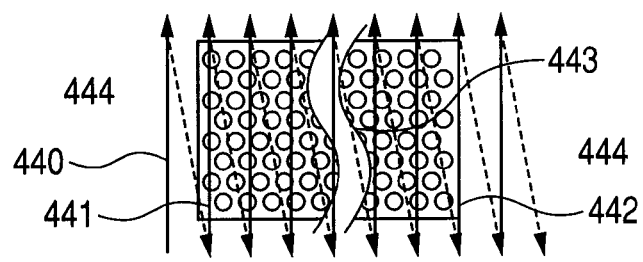
FIG. 5D shows an orbit change of secondary electrons emitted from each area.

In detail, based on a correlation between a difference between a set potential of the electrification control electrode B421 and the retarding potential Vr, and electrification potential of an inspection area of a semiconductor device after an inspection, at least one of the electrification control electrode B421 and the retarding voltage Vr is adjusted, and a setting is performed so that a surface potential difference between the electrification control electrode and a semiconductor device can be equal to a potential difference between the two after an inspection. As a result, it is possible to suppress the secondary electrons 428 which return to a semiconductor surface due to an off-axis potential barrier shown in FIG. 5A and to prevent excessive electrification of a semiconductor device during an inspection/measurement. A set voltage of the electrification control electrode B is set by 66 so that a contrast of a defective portion can be highest.

As described above, using the apparatus according to the first embodiment of the present invention, since surface potential of a semiconductor device becomes almost equal to electric potential of the electrification control electrode B421 in the above-described method, a secondary signal emitted from a semiconductor device by irradiation of a primary electron beam can maintain a constant electrification state during an inspection/measurement without charging an area beyond a scanning range of a primary electron beam. Also, an inspection/measurement of high sensitivity and high stability (reproducibility) can be realized by optimizing a set voltage of the electrification control electrode A420.

Second Embodiment

A second embodiment of the present invention will be described centering on an example that in order to form an optimal electrification state for an inspection target on a semiconductor device by pre-charging, a correlation between set potential of pre-charging and electrification of a pattern portion and a peripheral insulating layer after pre-charging and destaticizing is measured in advance, and pre-charging is performed based on the information before an inspection/measurement. The second embodiment of the present invention uses the same apparatus configuration as that of the first embodiment of the present invention, and thus only a setting method and an inspection/measurement sequence using the correlation information will be described.

Figures 3A, 3B:
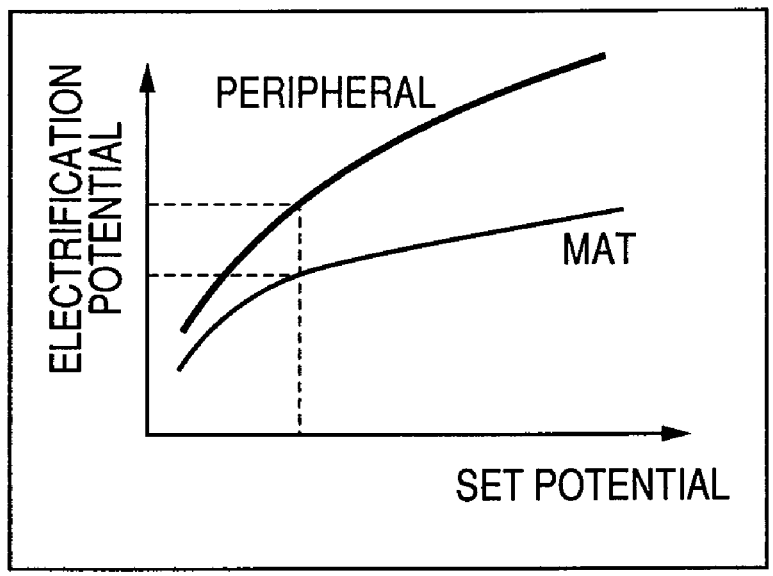
FIG. 3A shows a measurement result according to a second embodiment of the present invention.
FIG. 3B shows correlation data between a pre-charging/destaticizing set condition and electrification potential of respective areas on a semiconductor device.
Figure 4:
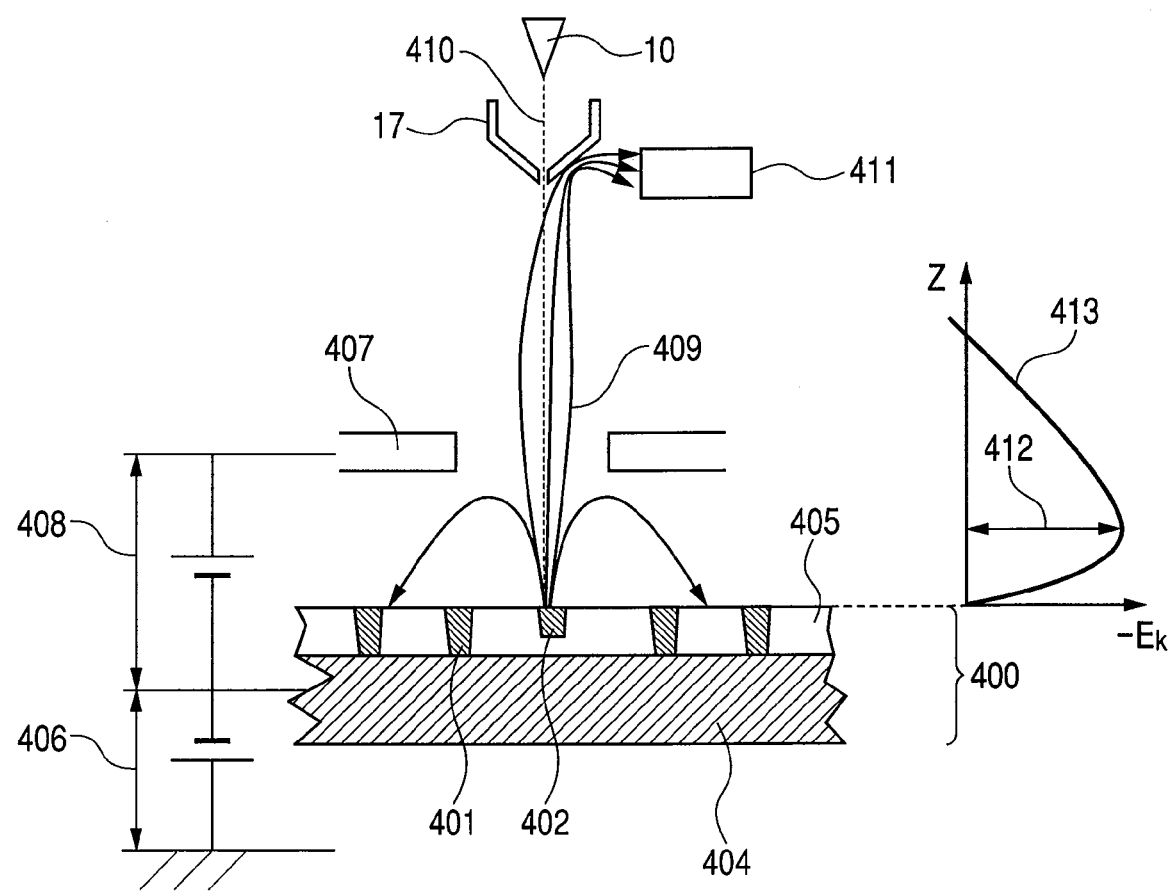
FIG. 4 is a view illustrating an SEM image of the semiconductor device.

FIG. 3A shows a measurement result according to the second embodiment of the present invention. A semiconductor device is pre-charged or destaticized by applying a set voltage for pre-charging/destaticizing (at least one of the retarding voltage Vr set by the control portion 68, a set voltage of the electrification control electrode A420 set by the control portion 66, a set voltage of the electrification control voltage B421 controlled by the control portion 423, and a set voltage of the control electrode 452 for preliminary electrification/destaticization). Then, electrification of each position on a semiconductor device surface is measured, and a distribution correlation between a set voltage for pre-charging/destaticizing and an actual electrification voltage is measured, and the data (FIG. 3B) is stored in the apparatus control portion 6 in advance.

Figure 7:
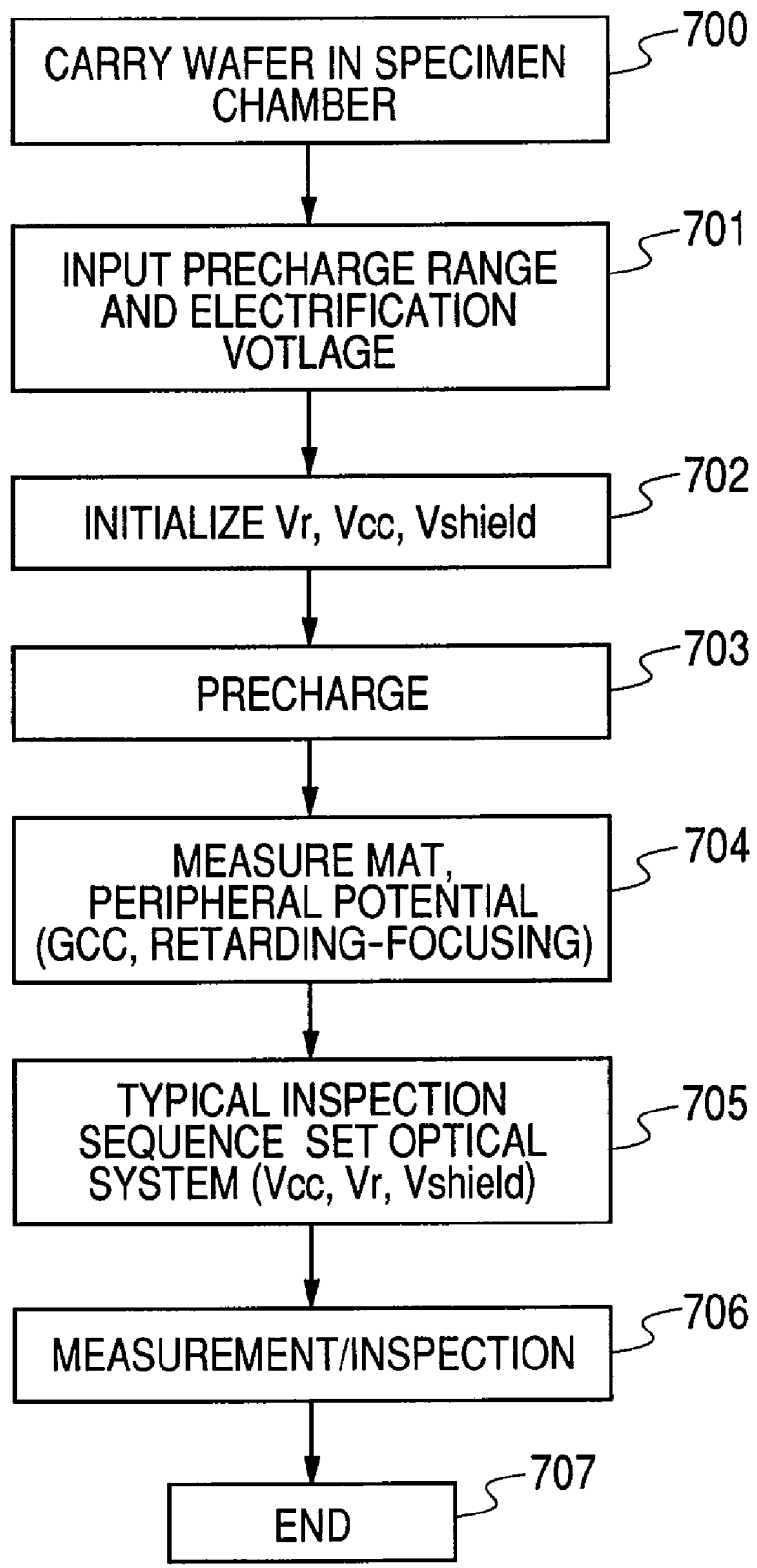
FIG. 7 is a view illustrating an inspection/measurement sequence using correlation data of pre-charging shown in FIG. 3 according to a second embodiment of the present invention.

FIG. 7 shows an inspection/measurement sequence using the correlation data according to the second embodiment of the present invention. After a semiconductor device (wafer) is carried into a specimen chamber (700), a range for pre-charging a semiconductor device and electrification potential are inputted through a graphic user interface (GUI) (701). A set value of each electrode for pre-charging/destaticizing is read out from the database of FIG. 3B (702), pre-charging/destaticizing is performed (703), electrification of a pattern portion is confirmed (704), a setting of an optical system and an inspection/measurement are performed (705 and 706), and the inspection sequence is finished (707).

Third Embodiment

In order to perform an optimum setting in an inspection/measurement, it is necessary to measure an electrification state of an inspection area and to feed it back to a setting, and electrification potential may be measured by using a primary electron beam. A third embodiment of the present invention will be described centering on a method for measuring electrification potential using a primary electron beam.

Figure 8A:
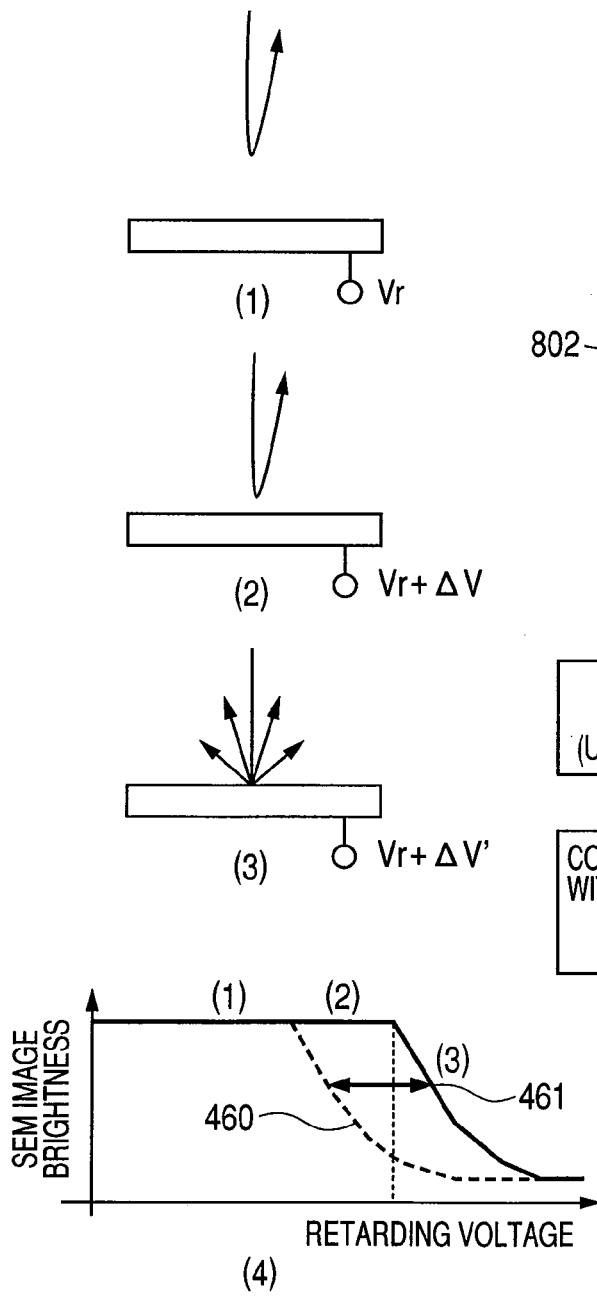
FIG. 8A is a view illustrating a principle for measuring electrification potential of a semiconductor device according to a third embodiment of the present invention.
Figure 8B:
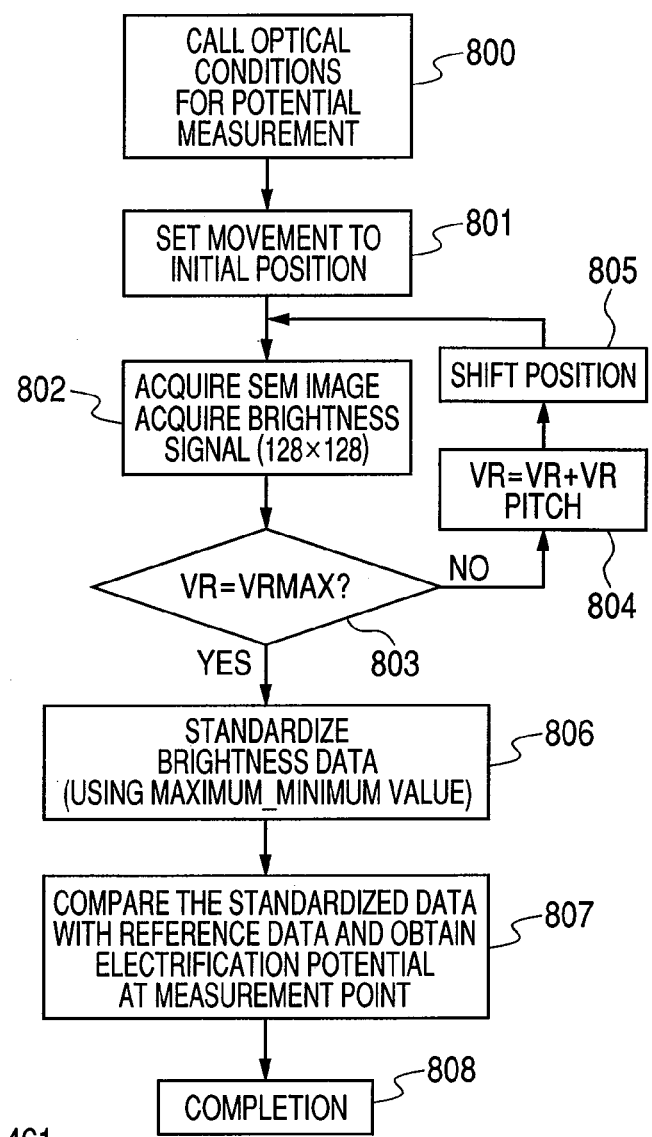
FIG. 8B is a view illustrating a sequence for measuring electrification potential of a semiconductor device according to a third embodiment of the present invention.

FIGS. 8A and 8B show a principle and a sequence for measuring electrification potential of a semiconductor device using a primary electron beam 19 (see FIG. 1), respectively. As shown in FIG. 8A, the principle is that an electronic signal strength-retarding voltage curve is obtained by measuring the electronic signal strength obtained by a detector while applying a retarding voltage. Since a retarding voltage is lower than an initial acceleration voltage of a primary electron beam at an initial stage, a primary electron beam is not incident to a semiconductor device and is reversed above a semiconductor device to be detected by a detector ((1) of FIG. 8A). As a retarding voltage is more shifted in a forward direction, a position that a primary electron beam is reversed is closer to a semiconductor ((2) of FIG. 8A). If a retarding voltage is shifted in a forward direction so that a primary electron beam contacts a semiconductor device surface, a secondary signal is generated from a surface and detected by a detector ((3) of FIG. 8A). The electronic signal strength detected by a detector when a primary electron beam contacts a semiconductor device surface has curves 460 and 461 shown in (4) of FIG. 8A since the strength that a primary electron beam is detected is different. The curve 460 is obtained from a specimen that electrification is already known, for example, it is measured from a holder around a wafer or a standard specimen (no electrification). The curve 461 is a curve measured from a measurement target. Electrification potential of a measurement target can be obtained from shift of the two.

FIG. 8B shows a measurement sequence. An optical condition for potential measurement is imported in advance (800). Then, it moves to an initial measurement position of a primary electron beam (801), and a brightness signal is extracted by acquiring an SEM image (802). Next, a retarding voltage is changed in a forward direction (804), and a brightness signal is extracted by acquiring an SEM image again. When an SEM image is acquired, a variation of electrification on a semiconductor device surface due to irradiation of a primary electron beam is suppressed, and in order to more accurately measure than in an original electrification state, it is effective to make an acquisition position of an SEM image (805) deviated whenever a retarding voltage is changed. An electron signal strength-retarding voltage curve can be obtained by repetitively performing the above-described operation until a maximum value is obtained. The standardization for the acquired curve is performed (806), it is compared to a reference curve (curve 406 shown in FIG. 8A), electrification potential of an inspection target is obtained (807), and the sequence is completed (808).

Measurement according to the third embodiment of the present invention is performed at plural positions on a semiconductor device surface, and thus it is possible to investigate an electrification potential distribution on a semiconductor device surface which is an inspection/measurement target, and it is also possible to inspect/measure a semiconductor device always in an optimum condition by feeding the information back to an inspection/measurement condition.

According to the present invention described above in detail, since a means for measuring electrification potential of a semiconductor device which is an inspection/measurement target is provided, it is possible to optimize pre-charging or to optimize a set voltage of each electrode containing an electrification control electrode A in an inspection/measurement. Also, by feeding the measurement result to a set voltage of an electrification control electrode B or a retarding voltage, it is possible to have an inspection area to maintain a constant electrification state during an inspection/measurement, whereby an inspection/measurement of high sensitivity and high reproducibility can be realized. In the above description, an electron beam is used as a charged particle beam; however, the present invention can be applied to a technique which performs an inspection/measurement by using a charged particle beam of a different kind such as an ion beam.

What is claimed is:

1. An apparatus for inspection and measurement which scans a semiconductor device having a pattern portion as an inspection target and an insulator portion formed around the pattern portion by a primary electron beam, detects a secondary signal of either or both of a secondary electron and a reflected electron generated from the semiconductor device, and images and displays the secondary signal detected, the apparatus comprising:
   an object lens for converging the primary electron beam;
   an electronic optical system which includes a ground electrode, an electrification control electrode A to which retarding potential is applied, and an electrification control electrode B which are disposed in order toward a semiconductor device side in a space above the semiconductor device; and
   a power source control portion which applies predetermined potential to the electrification control electrode A, the electrification control electrode B and the semiconductor device, respectively.

2. The apparatus of claim 1,
   wherein the power source control portion set applied potentials of the electrification control electrode A and the electrification control electrode B so that minimum potential between the electrification control electrode A and the electrification control electrode B is greater than minimum potential between the semiconductor device and the electrification control electrode B.

3. The apparatus of claim 1, further comprising:
   a measuring portion which measures electric potential of the pattern portion and the insulator portion of the semiconductor device,
   wherein the power source control portion controls the applied potential and sets the semiconductor device to an electrification state by using a measurement value of the measuring portion.

4. The apparatus of claim 3,
   wherein the power source control portion controls the applied potential based on a condition selected according to electrical characteristics of the pattern portion and the insulator portion and a purpose of an inspection/measurement so that a potential difference between the pattern portion and the insulator is smaller.

5. The apparatus of claim 3,
   wherein the power source control portion adjusts at least one of voltages which are applied to the electrification control electrode A, the electrification control electrode B and the semiconductor device according to an electrification state of the semiconductor device.

6. An apparatus for inspection and measurement which scans a specimen having a pattern portion as an inspection target and an insulator portion formed around the pattern portion by a charged particle beam, detects a secondary signal resulting from a secondary particle generated the specimen, and images and displays the secondary signal detected, the apparatus comprising:
   a charged particle beam source for generating the charged particle beam;
   a detector for detecting the secondary particle and generating the secondary signal;
   an image processing portion for processing the secondary signal from the detector;
   a scanning deflector for scanning the charged particle beam;
   an object lens for converging the charged particle beam;
   an electronic optical system which includes a ground electrode, a first electrification control electrode to which retarding potential is applied, and a second electrification control electrode which are disposed in order toward the specimen between the object lens and the specimen; and
   a power source control portion which applies predetermined potential to the first electrification control electrode and the second electrification control electrode of the optical system and the specimen, respectively.

7. The apparatus of claim 6,
   wherein the power source control portion controls applied potentials applied to the first electrification control electrode and the second electrification control electrode so that minimum potential between the first electrification control electrode and the second electrification control electrode is greater than minimum potential between the specimen and the second electrification control electrode.

8. The apparatus of claim 7, further comprising:
   a measuring portion which measures electric potential of the pattern portion and the insulator portion of the specimen,
   wherein the power source control portion controls the applied potential applied to the first electrification control electrode and the second electrification control electrode by using a measurement value of the measuring portion.

9. The apparatus of claim 8,
   wherein the power source control portion controls the applied potential applied to the first electrification control electrode and the second electrification control electrode so that a potential difference between the pattern portion and the insulator is smaller.

10. The apparatus of claim 8,
    wherein the power source control portion adjusts at least one of voltages which are applied to the first electrification control electrode, the second electrification control electrode and the specimen according to an electrification state of the specimen.

11. A method for inspection and measurement of a semiconductor device having a pattern portion as an inspection object and an insulator portion formed around the pattern portion, comprising:

scanning the semiconductor device by a primary electron beam converged by an object lens;

controlling electrification potential on a surface of the semiconductor device by using an electronic optical system which includes an electrification control electrode A to which retarding potential for the semiconductor device is applied and an electrification control electrode B disposed toward a semiconductor device side from the electrification control electrode A in a space above the semiconductor device;

detecting a secondary signal of either or both of a secondary electron and a reflected electron generated from the semiconductor device by irradiation of the primary electron beam; and imaging and displaying the detected signal.

12. The method of claim 11, further comprising:

measuring electrical potential of the pattern portion and the insulator portion; and setting applied potentials of the electrification control electrode A and the electrification control electrode B so that minimum potential between the electrification control electrode A and the electrification control electrode B is greater than minimum potential between the semiconductor device and the electrification control electrode B.

13. The method of claim 11, further comprising:

selecting a condition for electrically charging the semiconductor device according to a distribution and individual electrical characteristics of the pattern portion and the insulator portion and a purpose of an inspection/measurement so that a potential difference between the pattern portion and the insulator is as small as possible.

14. The method of claim 11, further comprising:

adjusting at least one of voltages which are applied to the electrification control electrode A, the electrification control electrode B and the semiconductor device according to an electrification state of the semiconductor device.

15. The method of claim 14, wherein a surface of the semiconductor device is charged to positive electrification by the adjusting step.

* * * * *